(12) United States Patent
Kimura

(10) Patent No.: US 10,389,084 B2
(45) Date of Patent: Aug. 20, 2019

(54) OPTICAL ELEMENT PACKAGE AND OPTICAL ELEMENT DEVICE

(71) Applicant: SHINKO ELECTRIC INDUSTRIES CO., LTD., Nagano-shi, Nagano (JP)

(72) Inventor: Yasuyuki Kimura, Nagano (JP)

(73) Assignee: SHINKO ELECTRIC INDUSTRIES CO., LTD., Nagano-shi (JP)

( * ) Notice: Subject to any disclaimer, the term of this patent is extended or adjusted under 35 U.S.C. 154(b) by 0 days.

(21) Appl. No.: 15/341,427

(22) Filed: Nov. 2, 2016

(65) Prior Publication Data

US 2017/0133821 A1    May 11, 2017

(30) Foreign Application Priority Data

Nov. 5, 2015  (JP) ................. 2015-217491

(51) Int. Cl.
| | |
|---|---|
| *H01S 5/022* | (2006.01) |
| *H01S 5/024* | (2006.01) |
| *H01S 5/026* | (2006.01) |
| *H01L 31/02* | (2006.01) |
| *H01L 31/16* | (2006.01) |

(52) U.S. Cl.
CPC ........ *H01S 5/02276* (2013.01); *H01S 5/0264* (2013.01); *H01S 5/02244* (2013.01); *H01S 5/02469* (2013.01); *H01L 31/02005* (2013.01); *H01L 31/16* (2013.01); *H01S 5/02212* (2013.01); *H01S 5/02252* (2013.01); *H01S 5/02284* (2013.01); *H01S 5/02288* (2013.01)

(58) Field of Classification Search
CPC ............. H01S 5/02288; H01S 5/02469; H01S 5/0264; H01S 5/024; H01S 5/026; H01S 3/04

USPC .......................................................... 372/34
See application file for complete search history.

(56) References Cited

U.S. PATENT DOCUMENTS

| | | | | |
|---|---|---|---|---|
| 4,152,624 A | * | 5/1979 | Knaebel | ............... H01L 33/483 257/434 |
| 5,993,075 A | * | 11/1999 | Huang | .................. G02B 6/4202 372/50.124 |
| 6,020,632 A | * | 2/2000 | Barone | ................. H01L 33/483 257/434 |
| 2004/0037334 A1 | * | 2/2004 | Funada | ............... H01S 5/02248 372/50.21 |
| 2004/0141535 A1 | * | 7/2004 | Sunaga | ............... H01S 5/02288 372/29.02 |

(Continued)

FOREIGN PATENT DOCUMENTS

| | | | | |
|---|---|---|---|---|
| JP | 2004-134697 | * | 4/2004 | ............. H01L 23/02 |
| JP | 2011-134740 | * | 7/2011 | ............. H01L 23/02 |

*Primary Examiner* — Tuan N Nguyen
(74) *Attorney, Agent, or Firm* — Rankin, Hill & Clark LLP

(57) ABSTRACT

An optical element package includes: an eyelet including an upper surface and a lower surface opposite to the upper surface; a heat releasing part disposed on the upper surface of the eyelet; a through hole formed through the eyelet to extend from the upper surface of the eyelet to the lower surface of the eyelet; a lead sealed by a certain member provided in the through hole and including a lead portion extending from the lower surface of the eyelet and a lead wiring portion extending from the upper surface of the eyelet; and an insulating substrate disposed between the lead wiring portion and the heat releasing part and comprising a front surface and a back surface opposite to the front surface.

6 Claims, 12 Drawing Sheets

(56) References Cited

U.S. PATENT DOCUMENTS

2004/0240497 A1* 12/2004 Oomori .............. H01S 5/02212
372/36
2016/0352069 A1* 12/2016 Kimura .............. H01S 5/02212

* cited by examiner (PLAN VIEW)

(ENLARGED SECTIONAL VIEW)

(PERSPECTIVE VIEW)

(SECTIONAL VIEW)

(PARTIAL SECTIONAL VIEW)

(PARTIAL PLAN VIEW)

OPTICAL ELEMENT PACKAGE AND OPTICAL ELEMENT DEVICE

This application claims priority from Japanese Patent Application No. 2015-217491, filed on Nov. 5, 2015, the entire contents of which are herein incorporated by reference.

BACKGROUND

1. Technical Field

The present disclosure relates to an optical element package, and an optical element device including the optical element package.

2. Description of the Related Art

According to the related art, there are optical element stems for mounting light-emitting elements, light-receiving elements, etc. In such an optical element stem, a light-emitting element is mounted on a side surface of a heat releasing part which is provided erectly on an eyelet shaped like a circular plate, and the light-emitting element is connected to leads which are sealed in the eyelet (see e.g., JP-A-2004-134697 and JP-A-2011-134740).

As will be described later in paragraphs about a preliminary matter, there has been proposed a technique in which a ceramic substrate including conductor patterns formed thereon is disposed on a side surface of a heat releasing part provided erectly on an eyelet, and a light-emitting element is mounted in the vicinities of the conductor patterns so that high frequency properties can be improved.

However, the conductor patterns on the ceramic substrate are connected to leads through solders. Therefore, transmission parts through the solders cause difficulty in matching of characteristic impedance of a transmission line as a whole. Thus, the transmission parts through the solders become obstacle parts in transmitting a high frequency signal.

SUMMARY

According to one or more aspects of the present disclosure, there is provided an optical element package. The optical element package comprises:

an eyelet comprising an upper surface and a lower surface opposite to the upper surface;

a heat releasing part disposed on the upper surface of the eyelet;

a through hole formed through the eyelet to extend from the upper surface of the eyelet to the lower surface of the eyelet;

a lead sealed by a certain member provided in the through hole and comprising a lead portion extending from the lower surface of the eyelet and a lead wiring portion extending from the upper surface of the eyelet; and an insulating substrate disposed between the lead wiring portion and the heat releasing part and comprising a front surface and a back surface opposite to the front surface.

DETAILED DESCRIPTION

An embodiment will be described below with reference to the accompanying drawings.

A preliminary matter underlying the embodiment will be described prior to description of the embodiment. Description of the preliminary matter is about the details of personal study of the present inventor, which contain contents of novel techniques rather than known techniques.

Figure 1A:
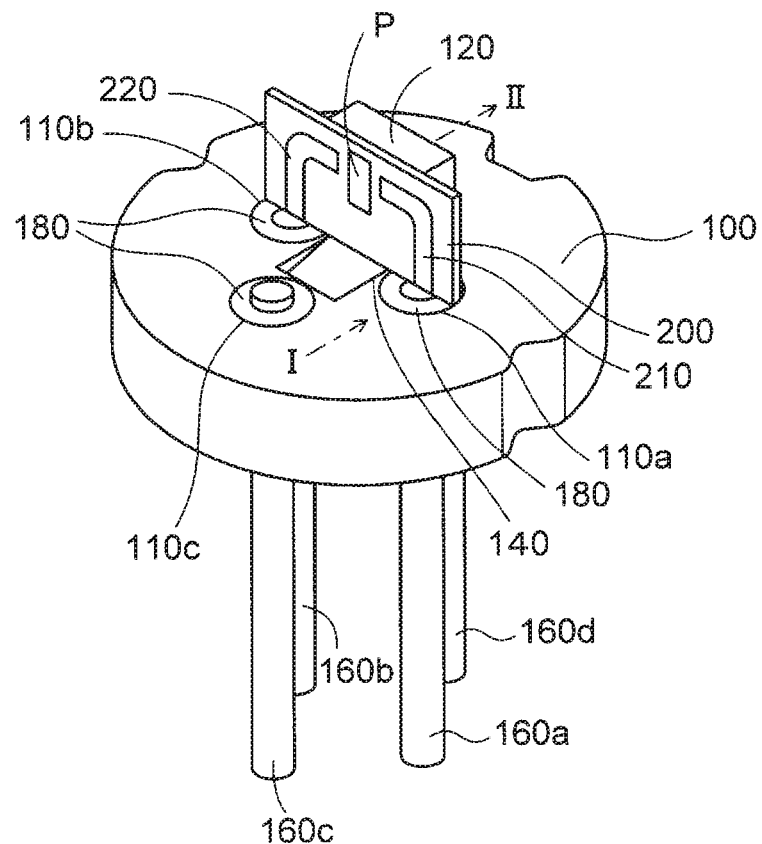
FIGS. 1A and 1B are a perspective view and a partial sectional view for explaining a problem of an optical element package according to a preliminary matter.

As shown in FIG. 1A, an optical element package according to the preliminary matter is provided with an eyelet 100, and a heat releasing part 120 which is provided erectly on the eyelet 100. Three through holes, i.e. first to third through holes 110a, 110b and 110c are provided to penetrate the eyelet 100 in a thickness direction thereof.

First to third leads 160a to 160c are sealed and fixed in the first to third through holes 110a to 100c by glasses 180 respectively. In addition, a fourth lead 160d is resistance-welded to a lower surface of the eyelet 100.

In addition, a ceramic substrate 200 is disposed on a side surface of the heat releasing part 120 provided erectly on the eyelet 100. A first conductor pattern 210, a second conductor pattern 220, and an element mounting pad P disposed in a region between the first and second conductor patterns 210 and 220 are formed on a front surface of the ceramic substrate 200. Each of the first and second conductor patterns 210 and 220 and the element mounting pad P is formed of a copper plating layer.

Figure 1B:
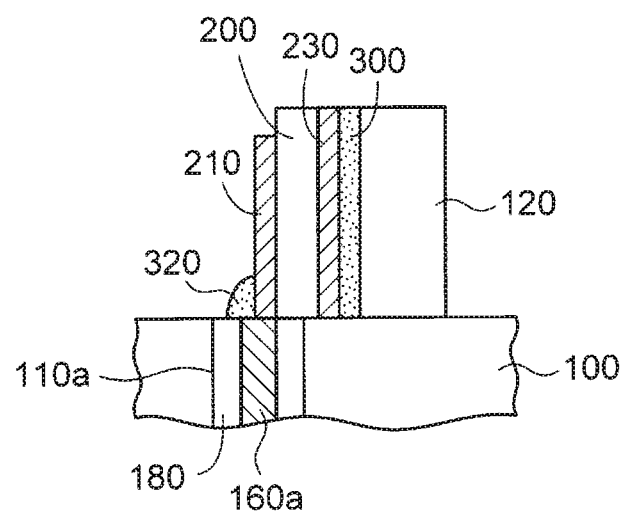

FIG. 1B is a partially enlarged sectional view in which sections of constituent members of the optical element package in FIG. 1A taken from an I direction toward an II direction are combined. As shown in FIG. 1B, a metal layer 230 functioning as the ground is formed on a back surface of the ceramic substrate 200. The metal layer 230 is bonded to the heat releasing part 120 by a solder 300.

In addition, a lower end of the first conductor pattern 210 formed on the front surface of the ceramic substrate 200 is disposed on an upper surface of the first lead 160a. In addition, a solder 320 is provided on the lower end of the first conductor pattern 210. The first conductor pattern 210 is electrically connected to the first lead 160a through the solder 320.

Although not shown particularly, the second conductor pattern 220 is electrically connected to the second lead 160b through a solder 320. The solders 320 on the lower ends of the first and second conductor patterns 210 and 220 are not shown in FIG. 1A.

A light-emitting element (not-shown) is mounted on the element mounting package P. The light-emitting element is connected to the first conductor pattern 210 and the second conductor pattern 220 on the front surface of the ceramic substrate 200 by wires (not shown).

Further, a recess portion 140 is formed in a portion of the eyelet 100 in front of the ceramic substrate 200. A light-receiving element (not shown) is mounted on the bottom of the recess portion 140. The light-receiving element is electrically connected to the second lead 160b by a wire (not shown).

In the optical element package according to the preliminary matter, the element mounting pad P on which the light-emitting element is mounted is disposed on the ceramic substrate 200, and the first and second conductor patterns 210 and 220 connected to the light-emitting element are disposed on opposite outer sides of the element mounting pad P.

Therefore, the light-emitting element and the first and second conductor patterns 210 and 220 can be disposed to be sufficiently near to each other in comparison with a structure in which the light-emitting element is connected to the first and second leads 160a and 160b by wires.

Thus, the length of each wire for connecting the light-emitting element to the first or second conductor pattern 210 or 220 can be reduced. Accordingly, a transmission loss of a transmission line can be reduced.

However, the first and second leads 160a and 160b are connected to the first and second conductor patterns 210 and 220 on the front surface of the ceramic substrate 200 through the solders 320. Transmission parts through the solders 320 become characteristic impedance mismatching parts which may be obstacles in transmitting a high frequency signal, for example, due to reflection of the high frequency signal on the transmission parts.

Therefore, when, for example, characteristic impedance is set at 25Ω as often used in the light-emitting element, it is difficult to match the characteristic impedance of the transmission line as a whole.

In addition, for manufacturing the optical element package according to the preliminary matter, first, the solder 300 is formed on the side surface of the heat releasing part 120, and the solders 320 are formed on the first and second leads 160a and 160b on the eyelet 100.

Further, the ceramic substrate 200 has to be positioned and disposed on the side surface of the heat releasing part 120 so that the lower ends of the first and second conductor patterns 210 and 220 of the ceramic substrate 200 can correspond to the first and second leads 160a and 160b.

Thus, a complicated work for assembling the ceramic substrate 200 with the package members has to be performed with high accuracy. This leads to an increase in cost.

The aforementioned problem can be solved in an optical element package according to an embodiment, which will be described below.

Embodiment

FIG. 2, FIGS. 3A and 3B, FIGS. 4 and 5, FIGS. 6A and 6B, FIG. 7, FIGS. 8A and 8B, and FIG. 9 are views for explaining a method for manufacturing the optical element package according to the embodiment. FIGS. 10A and 10B are views showing the optical element package according to the embodiment. While the method for manufacturing the optical element package is described, the structure of the optical element package will be described below.

Figure 2:
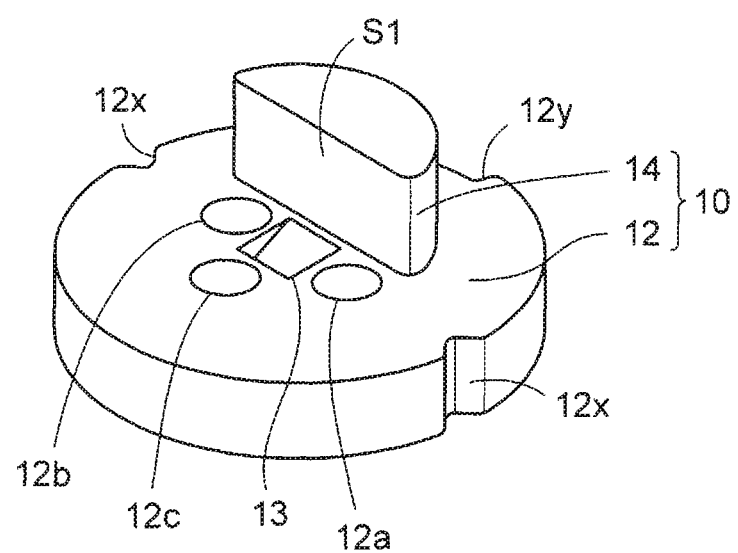
FIG. 2 is a perspective view showing a metal base used in an optical element package according to an embodiment.

In the first place, a metal base used in the optical element package according to the embodiment will be described. As shown in FIG. 2, the metal base 10 is formed to include an eyelet 12 which is shaped like a circular plate, and a heat releasing part 14 which is provided erectly on the eyelet 12.

The heat releasing part 14 includes a vertical side surface S1 provided on a central portion of the eyelet 12. In the example of FIG. 2, the heat releasing part 14 is formed into a semicircularly cylindrical shape. However, the heat releasing part 14 may be shaped like a cube or a rectangular parallelepiped etc.

A recess portion 13 whose bottom is sloped is formed in a portion of the eyelet 12 in front of the heat releasing part 14.

The eyelet 12 has an upper surface and a lower surface opposite to the upper surface. A pair of triangular notch portions 12x for positioning and a quadrangular notch portion 12y for direction indication are provided in an outer circumference of the eyelet 12. First to third through holes 12a, 12b, 12c are formed through the eyelet 12 to extend from the upper surface of the eyelet 12 to the lower surface of the eyelet 12.

The metal base 10 is manufactured by stamping a metal member integrally using a die. Preferably, iron or copper etc. is used as the material of the metal base 10.

Three through holes, i.e. first to third through holes 12a, 12b and 12c are provided to penetrate the eyelet 12 in a thickness direction thereof.

Further, nickel (Ni)/gold (Au) plating layers (not shown) are sequentially formed in a direction from bottom to top on the whole of an external surface of the metal base 10. The nickel (Ni)/gold (Au) plating layers are formed by electroplating.

Next, a method for mounting leads into the first to third through holes 12a to 12c of the eyelet will be described.

In the embodiment, a first lead and a second lead for a light-emitting element are mounted into the first and second through holes 12a and 12b of the eyelet 12. In addition, a third lead for a light-receiving element is mounted into the third through hole 12c of the eyelet 12.

First, the method for mounting the first lead and the second lead for the light-emitting element will be described.

In the embodiment, the leads are extended to an upper side of the eyelet 12 to form lead wiring portions in place of the first and second conductor patterns 210 and 220 on the front surface of the ceramic substrate 200 described according to the aforementioned preliminary matter.

Figure 3A:
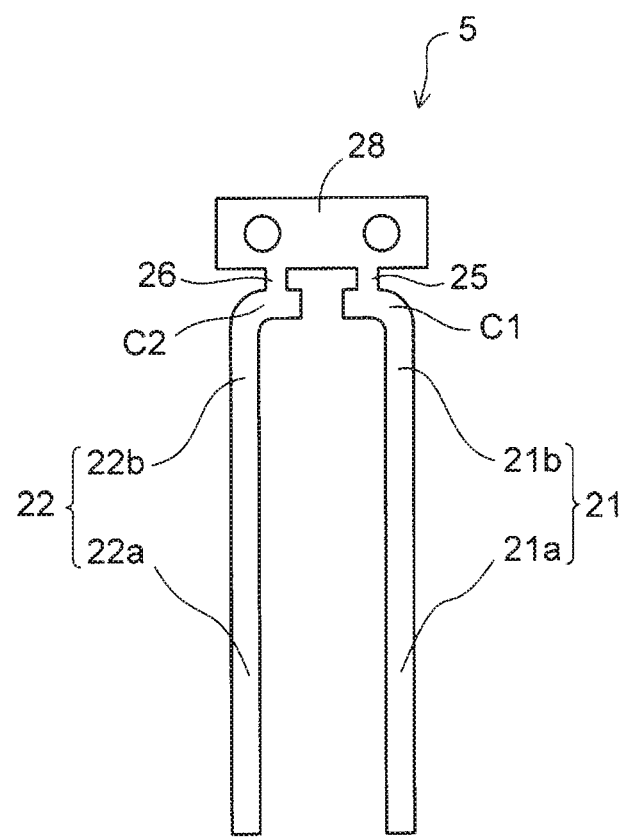
FIGS. 3A and 3B are a plan view showing a lead member used in the optical element package according to the embodiment and a sectional view showing a lead of the lead member.

First, a lead member 5 in which a first lead 21 and a second lead 22 are coupled by a tie-bar 28 is prepared, as shown in a plan view of FIG. 3A.

The first lead 21 is provided with a lead portion 21a and a lead wiring portion 21b. The lead portion 21a is disposed on a lower side of the aforementioned eyelet 12. Also, the lead portion 21a extends from the lower surface of the eyelet 12. The lead wiring portion 21b is disposed on the upper side of the eyelet 12. Also, the lead wiring portion 21b extends from the upper surface of the eyelet 12. The lead wiring portion 21b is provided with a connection portion C1 which is disposed to be bent inward on an upper end side of the lead wiring portion 21b. The connection portion C1 of the lead wiring portion 21b is connected to the tie-bar 28 through a coupling portion 25.

Similarly, the second lead 22 is provided with a lead portion 22a and a lead wiring portion 22b. The lead portion 22a is disposed on the lower side of the eyelet 12. Also, the lead portion 22a extends from the lower surface of the eyelet 12. The lead wiring portion 22b is disposed on the upper side of the eyelet 12. Also, the lead wiring portion 22b extends from the upper surface of the eyelet 12. The lead wiring portion 22b is provided with a connection portion C2 which is disposed to be bent inward on an upper end side of the lead wiring portion 22b. The connection portion C2 of the lead wiring portion 22b is connected to the tie-bar 28 through a coupling portion 26.

The tie-bar 28 of the lead member 5 is broken off at the coupling portions 25 and 26 so that the lead wiring portion 21b of the first lead 21 and the lead wiring portion 22b of the second lead 22 can be separated from the tie-bar 28. The width of each of the parts of the lead member 5 to be broken off at the coupling portions 25 and 26 is locally narrowed so that the tie-bar 28 can be broken off easily.

A method for forming such a lead member 5 is as follows. That is, first, a resist pattern is formed on a thin metal plate based on photolithography. Further, the metal plate is perforated and patterned by wet etching with the resist pattern as a mask.

Thus, the first and second leads 21 and 22 provided with the lead wiring portions 21b and 22b bent inward on their upper end sides can be formed easily. For example, an iron (50%)-nickel (50%) alloy can be used as the material of the first and second leads 21 and 22.

Figure 3B:

As shown in a sectional view of FIG. 3B, the thin metal plate is patterned and formed into the first and second leads 21 and 22. Accordingly, the section of each of the first and second leads 21 and 22 can be formed into a quadrangular shape such as a rectangular shape.

As will be described later, the lead wiring portion 21b of the first lead 21 and the lead wiring portion 22b of the second lead 22 function as the first conductor pattern 210 and the second conductor pattern 220 on the front surface of the ceramic substrate 200 described according to the preliminary matter.

Figure 4:
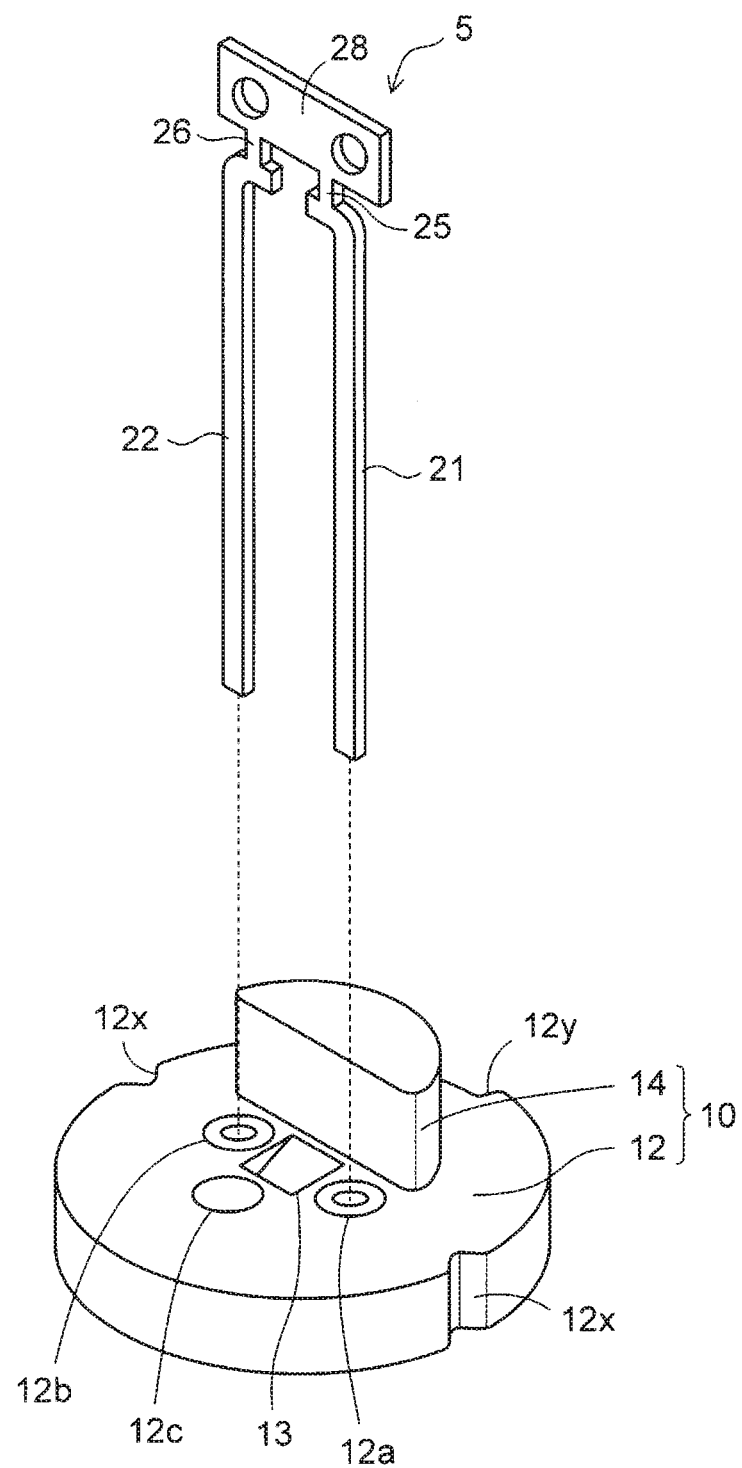
FIG. 4 is a perspective view (part 1) for explaining a method for manufacturing the optical element package according to the embodiment.
Figure 5:
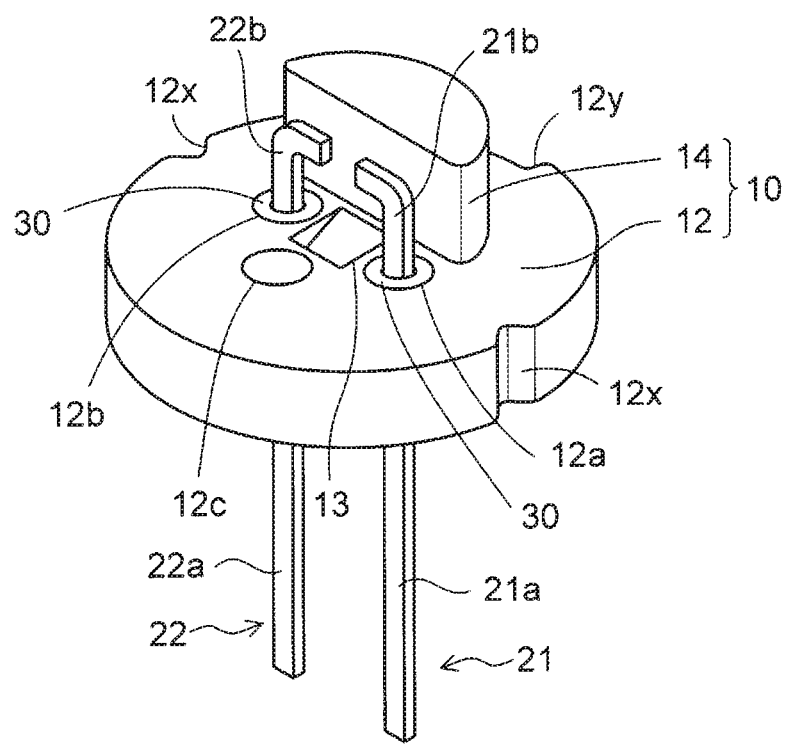
FIG. 5 is a perspective view (part 2) for explaining the method for manufacturing the optical element package according to the embodiment.

Next, the first lead 21 and the second lead 22 of the lead member 5 in the aforementioned FIGS. 3A and 3B are inserted into the first through hole 12a and the second through hole 12b of the eyelet 12 in FIG. 2, and sealed and fixed therein by glasses 30, as shown in FIGS. 4 and 5.

Further, when the tie-bar 28 of the lead member 5 in FIG. 4 is broken off at the coupling portions 25 and 26, the tie-bar 28 is separated and removed from the lead wiring portion 21b of the first lead 21 and the lead wiring portion 22b of the second lead 22, as shown in FIG. 5. Thus, the first lead 21 and the second lead 22 are separated from each other to become independent leads.

In this manner, the first lead 21 and the second lead 22 which have been coupled to the tie-bar 28 are sealed in the first and second through holes 12a and 12b of the eyelet 12. Therefore, a problem that the pitch with which the first and second leads 21 and 22 are arranged may be deviated or that the first and second leads 21 and 22 may be rotated and fixed can be prevented from occurring.

Accordingly, the lead wiring portions 21b and 22b of the first and second leads 21 and 22 can be disposed in positions according to design specifications with high accuracy. Thus, when the lead wiring portions 21b and 22b are disposed on an insulating substrate and function as conductor patterns as will be described later, deterioration of electric properties can be prevented.

In this manner, the lead portion 21a of the first lead 21 is disposed on the lower side of the eyelet 12, and the lead wiring portion 21b of the first lead 21 is disposed on the upper side of the eyelet 12. Similarly, the lead portion 22a of the second lead 22 is disposed on the lower side of the eyelet 12, and the lead wiring portion 22b of the second lead 22 is disposed on the upper side of the eyelet 12.

Figure 6A:
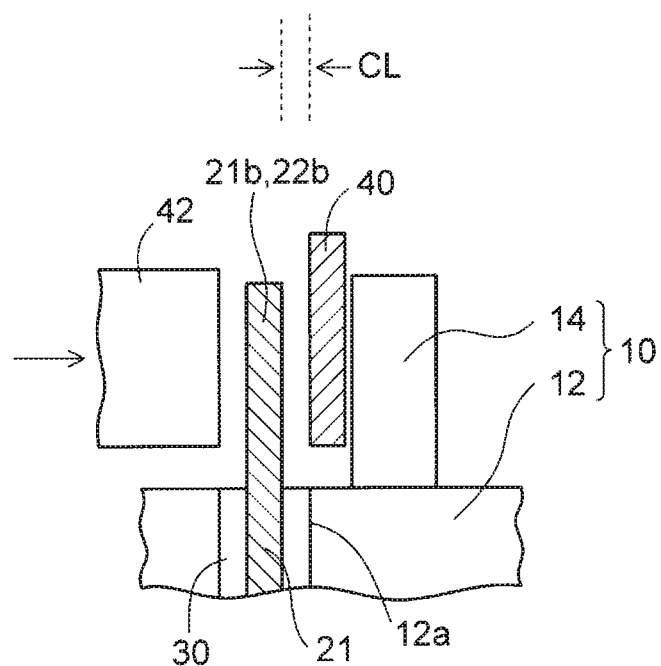
FIGS. 6A and 6B are sectional views (part 3) for explaining the method for manufacturing the optical element package according to the embodiment.

Next, a spacer 40 is disposed between the lead wiring portions 21b and 22b of the first and second leads 21 and 22 and the heat releasing part 14 on the eyelet 12, and the lead wiring portions 21b and 22b are pressed against the spacing 40 by a pressing member 42, as shown in FIG. 6A. For example, a clearance CL between the lead wiring portions 21b and 22b and the spacer 40 is set at about 200 μm.

Figure 6B:
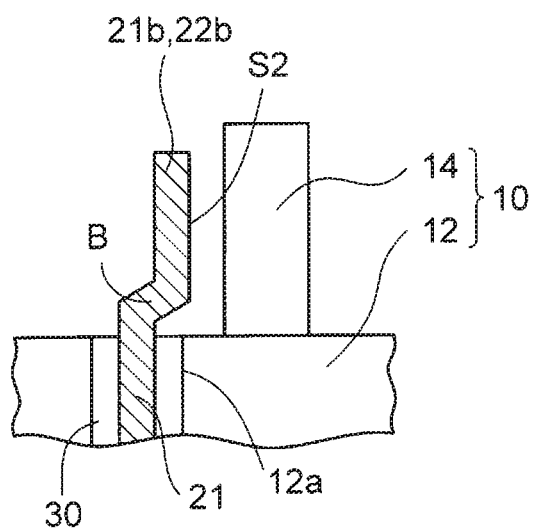

Thus, as shown in FIG. 6B, the lead wiring portions 21b and 22b are bent toward the heat releasing part 14 at their proximal portions on the eyelet 12. As a result, bent portions B are formed. At the same time, side surfaces S2 of the lead wiring portions 21b and 22b on the heat releasing part 14 side are pressed against the spacer 40. Thus, the side surfaces S2 of the lead wiring portions 21b and 22b, each of which faces the spacer 40, are substantially in parallel with the surface of the spacer 40. As a result of this, the side surfaces S2 are substantially in parallel with the insulating substrate 50 (described later).

Thus, the lead wiring portions 21b and 22b on the eyelet 12 are pressed against the spacer 40 by the pressing member 42 to be plastically deformed. Thus, even in the case where the lead wiring portions 21b and 22b are slanted slightly, the side surfaces S2 of the lead wiring portions 21b and 22b can be corrected to be vertical.

Figure 7:
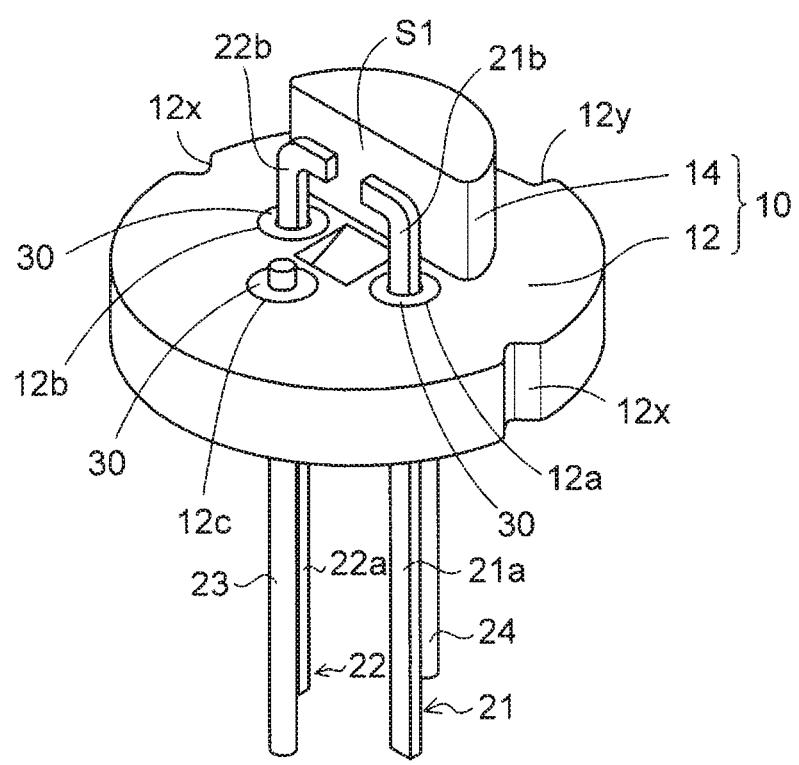
FIG. 7 is a perspective view (part 4) for explaining the method for manufacturing the optical element package according to the embodiment.

Next, a third lead 23 having a circularly cylindrical shape is inserted into the third through hole 12c of the eyelet 12 in FIG. 5, and sealed and fixed therein by a glass 30, as shown in FIG. 7. Further, a fourth lead 24 is fixed to the lower surface of the eyelet 12 by resistance welding. The bent portions B are not shown in the lead wiring portions 21b and 22b illustrated in and after FIG. 7.

Figure 8A:
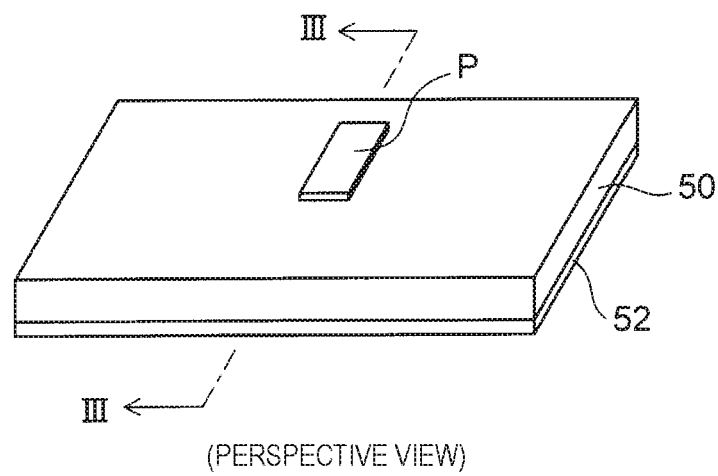
FIGS. 8A and 8B are a perspective view and a sectional view (part 5) for explaining the method for manufacturing the optical element package according to the embodiment.
Figure 8B:
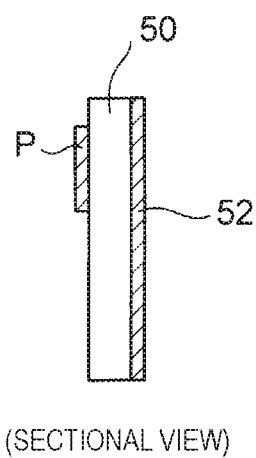

Successively, an insulating substrate 50 having an element mounting pad P formed on its front surface and a metal layer 52 formed on its back surface is prepared, as shown in FIGS. 8A and 8B, FIG. 8B is a sectional view taken along a line III-III of a perspective view of FIG. 8A.

The insulating substrate 50 has a front surface and a back surface opposite to the front surface. A light-emitting element is mounted on the element mounting pad P formed on the front surface of the insulating substrate 50. In addition, the metal layer 52 formed on the back surface of the insulating substrate 50 functions as the ground. The metal layer 52 is formed on the whole of the back surface of the insulating substrate 50.

Each of the element mounting pad P and the metal layer 52 is formed of a metal plating layer made of copper etc. When a semi-additive method is used, each of the element mounting pad P and the metal layer 52 is formed of a seed layer and a metal plating layer formed thereon.

The area of the insulating substrate 50 corresponds to the area of the side surface S1 of the heat releasing part 14 of the metal base 10 in the aforementioned FIG. 7.

Preferably, a ceramic substrate made of aluminum nitride or aluminum oxide etc. is used as the insulating substrate 50. Alternatively, a resin film such as a polyimide film may be used as the insulating substrate 50.

Figure 9:
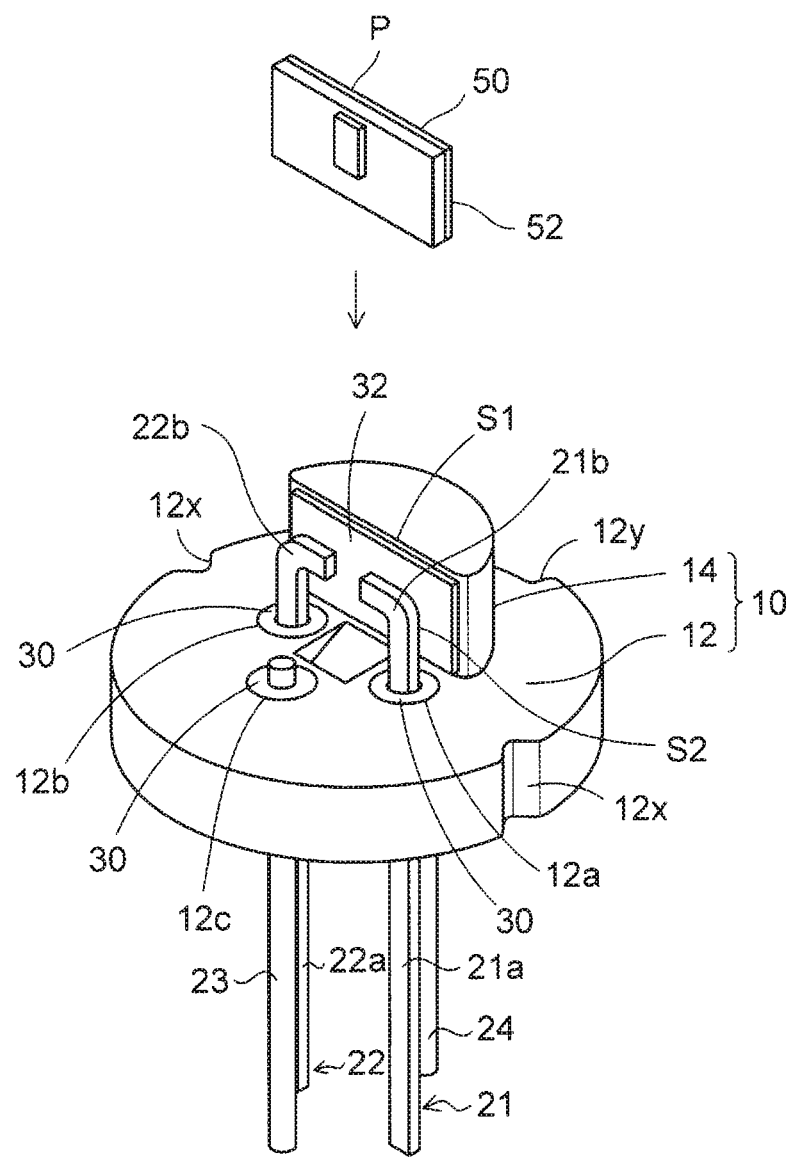
FIG. 9 is a perspective view (part 5) for explaining the method for manufacturing the optical element package according to the embodiment.
Figure 10A:
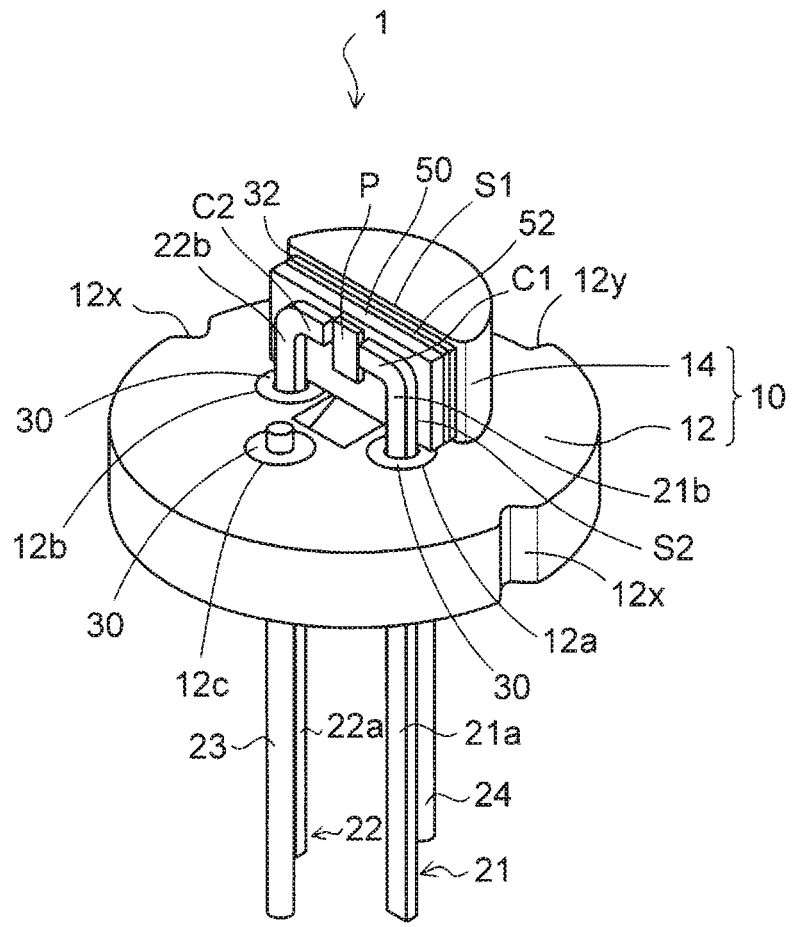
FIGS. 10A and 10B are a perspective view and a partial sectional view showing the optical element package according to the embodiment.
Figure 10B:
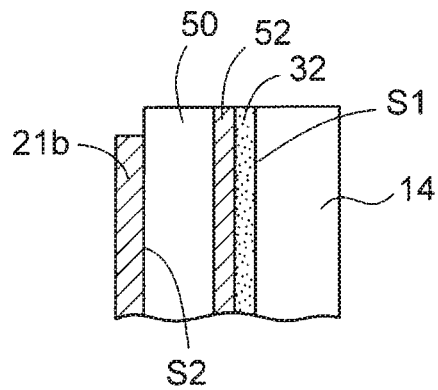

As shown in FIG. 9, a solder 32 is formed on the side surface S1 of the heat releasing part 14 of the metal base 10 in FIG. 7. Successively, the insulating substrate 50 in FIGS. 8A and 8B is inserted and disposed into a region between the side surfaces S2 of the first and second lead wiring portions 21b and 22b and the side surface S1 of the heat releasing part 14.

Thus, the insulating substrate 50 is disposed in such a manner that the element mounting pad P on the front surface of the insulating substrate 50 faces the side of the lead wiring portions 21b and 22b and the metal layer 52 on the back surface of the insulating substrate 50 abuts against the side surface S1 of the heat releasing part 14, as shown in FIGS. 10A and 10B. A partial sectional view of FIG. 10B shows a section ranging from the lead wiring portion 21b in a perspective view of FIG. 10A to the heat releasing part 14.

Further, the solder 32 is melted by reflow heating. As a result, the metal layer 52 on the back surface of the insulating substrate 50 is bonded to the side surface S1 of the heat releasing part 14 of the metal base 10 by the solder 32. Thus, the metal layer 52 on the back surface of the insulating substrate 50 is electrically connected to the heat releasing part 14 and the eyelet 12 through the solder 32.

Preferably, a gold(Au)/tin(Sn)-based solder can be used as the solder 32. Since the gold(Au)/tin(Sn)-based solder is high in thermal conductivity, heat generated from the light-emitting element can be released from the insulating substrate 50 toward the heat releasing part 14 through the solder 32 efficiently.

The gold(Au)/tin(Sn)-based solder is relatively high in melting point and has a reflow temperature of 280° C. to 300° C. In bonding using a solder material such as a silver solder requiring heat treatment of about 700° C., the gold layer on the front surface of the metal base 10 is diffused.

Among various solders, the gold(Au)/tin(Sn)-based solder is relatively high in reflow temperature and high in thermal conductivity, and the gold layer on the front surface of the metal base 10 is not diffused. Therefore, the gold (Au)/tin(Sn)-based solder is preferable.

In addition, on the element mounting pad P side of the insulating substrate 50, the lead wiring portions 21b and 22b of the first and second leads 21 and 22 are disposed on the insulating substrate 50 on the opposite outer sides of the element mounting pad P. The lead wiring portions 21b and 22b are disposed so as not to protrude outward from the insulating substrate 50.

As shown in the partial sectional view of FIG. 10B, the lead wiring portions 21b and 22b directly contacts the front surface of the insulating substrate 50, and no solder is formed between the insulating substrate 50 and the lead wiring portions 21b and 22b.

As described in the aforementioned FIGS. 6A and 6B, the side surfaces S2 of the lead wiring portions 21b and 22b disposed on the upper side of the eyelet 12 are pressed against the heat releasing part 14 and corrected to be vertical surfaces. In addition, an interval between the lead wiring portions 21b and 22b and the side surface S1 of the heat releasing part 14 is set to be slightly narrower than the thickness of the insulating substrate 50.

Therefore, in order to insert the insulating substrate 50 into the region between the lead wiring portions 21b and 22b and the heat releasing part 14, the insulating substrate 50 is inserted while pressed by the lead wiring portions 21b and 22b. As a result, as shown in the partial sectional view of FIG. 10B, the side surfaces S2 of the lead wiring portions 21b and 22b abut against the front surface of the insulating substrate 50 without any gap of an air layer.

In this manner, no solder is used but the lead wiring portions 21b and 22b can be brought into tight contact with the side surface S1 of the heat releasing part 14 without any gap.

Therefore, no solder has to be formed on the side surfaces S2 of the lead wiring portions 21b and 22b. It will go well if the solder 32 is simply formed on the side surface S1 of the heat releasing part 14. In addition, when the insulating substrate 50 is disposed between the lead wiring portions 21b and 22b and the heat releasing part 14, it will go well if the lead wiring portions 21b and 22b are simply disposed on the opposite outer sides of the element mounting pad P. Accordingly, no accurate positioning is required.

Accordingly, the work for assembling the insulating substrate 50 with the package members can be simplified more greatly than the optical element package according to the preliminary matter.

Incidentally, when the lead wiring portions 21b and 22b have to be fixed to the insulating substrate 50 completely, the lead wiring portions 21b and 22b may be fixed to the insulating substrate 50 by solders etc. although the work will become complicated.

In the aforementioned manner, the optical element package 1 according to the embodiment can be obtained.

As shown in FIGS. 10A and 10B, the optical element package 1 according to the embodiment is provided with the metal base 10. The metal base 10 includes the eyelet 12 described in FIG. 2, and the heat releasing part 14 provided erectly on the eyelet 12. The three through holes, i.e. the first to third through holes 12a, 12b and 12c are formed in the eyelet 12.

The first lead 21 is sealed and fixed in the first through hole 12a by the glass 30. The first lead 21 is provided with the lead portion 21a which is disposed to extend on the lower side of the eyelet 12, and the lead wiring portion 21b which is disposed to extend on the upper side of the eyelet 12.

In addition, the lead wiring portion 21b of the first lead 21 is provided with the connection portion C1 disposed to be bent inward on its front end side.

Similarly, the second lead 22 is sealed and fixed in the second through hole 12b by the glass 30. The second lead 22 is provided with the lead portions 22a which is disposed to extend on the lower side of the eyelet 12, and the lead wiring portion 22b which is disposed to extend on the upper side of the eyelet 12.

Similarly, the lead wiring portion 22b of the second lead 22 is provided the connection portion C2 disposed to be bent inward on its front end side.

The connection portion C1 on the front end side of the first lead 21 and the connection portion C2 on the front end side of the second lead 22 are disposed to face each other.

Further, the third lead 23 having a circularly cylindrical shape is sealed and fixed in the third through hole 12c of the eyelet 12 by the glass 30. In addition, the fourth lead 23 is fixed to the lower surface of the eyelet 12 by resistance welding.

The insulating substrate 50 is inserted and disposed between the side surfaces S2 of the lead wiring portions 21b and 22b of the first and second leads 21 and 22 and the side surface S1 of the heat releasing part 14. The element mounting pad P is formed on an upper central portion of the front surface of the insulating substrate 50. The metal layer 52 functioning as the ground is formed on the whole of the back surface of the insulating substrate 50.

Refer to FIG. 10B in addition to FIG. 10A. The metal layer 52 on the back surface of the insulating substrate 50 is bonded to the side surface S1 of the heat releasing part 14 by the solder 32. On the other hand, the lead wiring portion 21b of the first lead 21 and the lead wiring portion 22b of the second lead 22 are disposed to directly contact the front surface of the insulating substrate 50 on the opposite outer sides of the element mounting pad P without the interposition of any solder therebetween.

The element mounting pad P is disposed in the region in which the connection portion C1 of the lead wiring portion 21b and the connection portion C2 of the lead wiring portion 22b face each other. Namely, the element mounting pad P faces the connection portion C1 of the lead wiring portion 21b and the connection portion C2 of the lead wiring portion 22b, respectively.

In the optical element package 1 according to the embodiment, parts of the first and second leads 21 and 22 extended upward from the eyelet 12 serve as the lead wiring portions 21b and 22b which are disposed on the front surface of the insulating substrate 50. In addition, the metal layer 52 is disposed on the whole of the back surface of the insulating substrate 50.

In this manner, a microstrip line is constructed by the insulating substrate 50, the lead wiring portions 21b and 22b on the front surface of the insulating substrate 50, and the metal layer 52 on the back surface of the insulating substrate 50. In order to secure required characteristic impedance in the microstrip line, the lead wiring portions 21b and 22b are disposed within the front surface of the insulating substrate 50. That is, the lead wiring portions 21b and 22b are disposed so as not to protrude outward from the insulating substrate 50.

The optical element package 1 according to the embodiment is different from the structure according to the aforementioned preliminary matter as follows. That is, the leads are not connected to conductor patterns by solders, but the lead portions 21a and 22a are extended to the lead wiring portions 21b and 22b which are disposed and used as the conductor patterns.

Therefore, a high frequency signal can be transmitted inside conductors which range from the lead portions 21a and 22a to the connection portions C1 and C2 of the lead wiring portions 21b and 22b and which are made of the same metal material and have the same shape. Accordingly, the signal is prevented from being reflected inside the conductors, so that a transmission loss can be reduced.

Therefore, characteristic impedance can be set at 25Ω and the characteristic impedance of the transmission line as a whole can be matched.

The members for making the characteristic impedance equal to 25Ω have following specifications.

Thickness of Insulating Substrate 50 (Ceramic Substrate (Dielectric Constant: 9)): 0.2 mm
Thickness of Lead wiring portion 21b, 22b: 0.2 mm
Width of Lead wiring portion 21b, 22b: 0.36 mm
Thickness of Metal Layer 52 (Ground): 0.2 mm Thus, the characteristic impedance of the transmission line as a whole can be matched. Accordingly, the optical element package 1 can support higher-speed transmission of an electric signal and support applications of large capacity optical communication whose speed is not lower than 10 Gbps.

Assume that a polyimide film (dielectric constant: 3.9) is used as the insulating substrate 50 and the characteristic impedance is set at 25Ω. In this case, the dielectric constant of the insulating substrate 50 is smaller than that in the case where the ceramic substrate (dielectric constant: 9) is used.

For this reason, it is necessary to reduce the thickness of the insulating substrate 50 correspondingly to the smaller dielectric constant of the insulating substrate 50. Accordingly, it is necessary to narrow the interval between the lead wiring portions 21b and 22b and the heat releasing part 14. Thus, it is necessary to reduce the thickness of the insulating substrate 50 and it spends time and labor unfavorably on assembling the insulating substrate 50.

Thus, when a ceramic substrate relatively large in dielectric constant is used as the insulating substrate 50 in the case where the characteristic impedance is set at 25Ω, the insulating substrate 50 can be secured to be comparatively thick to be about 0.2 mm thick.

Thus, the interval between the lead wiring portions 21b and 22b and the heat releasing part 14 can be secured sufficiently. Accordingly, it is easy to assemble the insulating substrate 50 favorably for manufacturing.

In addition, the ceramic substrate is higher in thermal conductivity than the polyimide film. Accordingly, the ceramic substrate is also excellent in heat releasing properties.

Next, a method for mounting an optical element on the optical element package 1 in FIGS. 10A and 10B to construct an optical element device will be described.

Figure 11A:
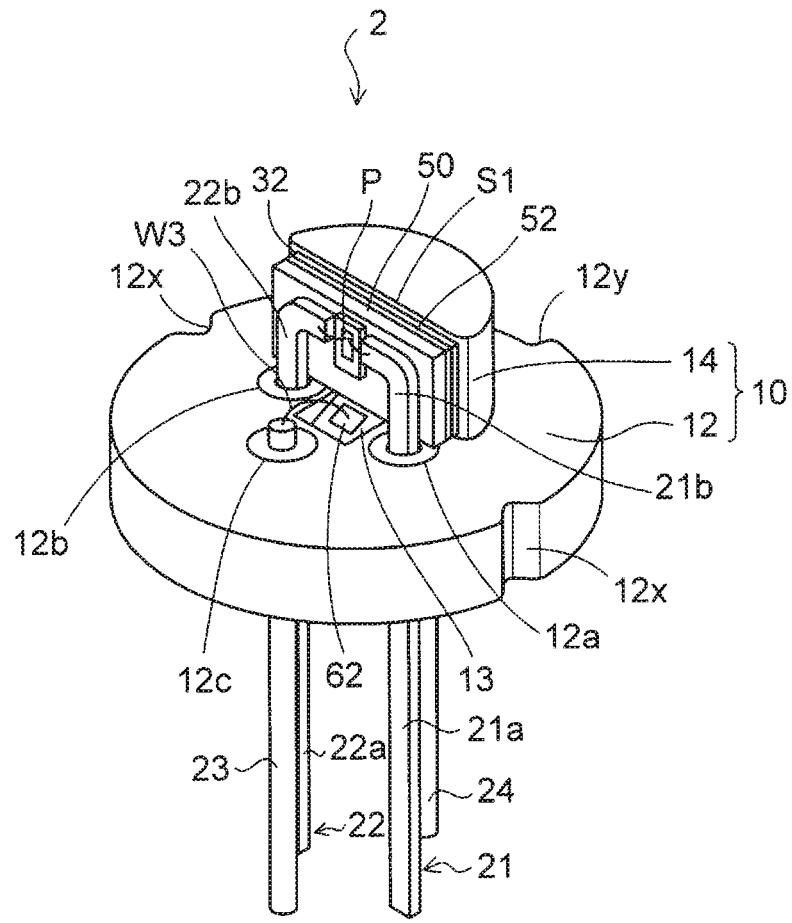
FIGS. 11A and 11B are a perspective view and a partial sectional view showing an optical element device according to the embodiment.
Figure 11B:
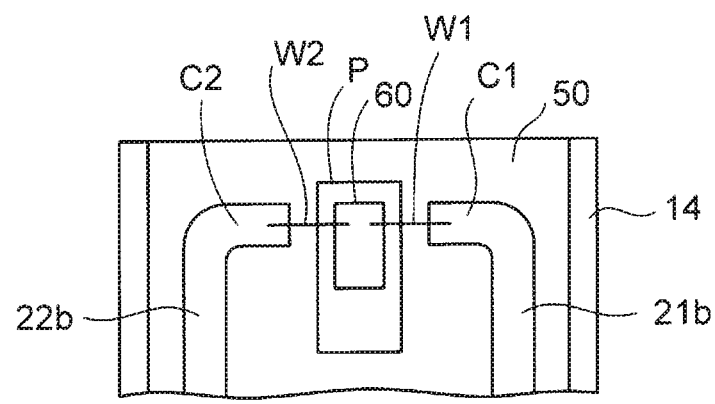

As shown in FIGS. 11A and 11B, a semiconductor laser element 60 is fixed and mounted as a light-emitting element on the element mounting pad P on the front surface of the insulating substrate 50 of the optical element package 1 in FIG. 10A by a die attach material. FIG. 11B is a partial front view when the optical element package 1 in FIG. 11A is seen from the front.

As shown in FIG. 11B, the semiconductor laser element 60 is connected to the connection portions C1 and C2 of the lead wiring portions 21b and 22b on opposite outer sides of the semiconductor laser element 60 by wires W1 and W2 respectively. The wires W1 and W2 are formed by a wire bonding method. The wires W1 and W2 are formed of gold wires etc.

As shown in FIG. 11A, a photodiode 62 is fixed and mounted as a light-receiving element on the bottom of the recess portion 13 of the eyelet 12 of the optical element package 1 by a die attach material. Further, the photodiode 62 is connected to an upper surface of the third lead 23 through a wire W3.

In the aforementioned manner, the semiconductor laser element 60 and the photodiode 62 are mounted on the optical element package 1. Thus, an optical element device 2 can be obtained.

As described above, the lead wiring portions 21b and 22b are disposed in the vicinities of the opposite outer sides of the element mounting pad P on the front surface of the insulating substrate 50 in the optical element device 2, as shown in FIG. 11B. Therefore, the semiconductor laser element 60 and the lead wiring portions 21b and 22b can be disposed to be sufficiently near to each other.

Thus, the length of each of the wires W1 and W2 for connecting the semiconductor laser element 60 to the connection portions C1 and C2 of the lead wiring portions 21b and 22b can be shortened. Accordingly, the transmission loss of the transmission line can be reduced.

In addition, the lead portions 21a and 22a are extended to the lead wiring portions 21b and 22b which are disposed and used as conductor patterns. Accordingly, no high frequency signal is reflected so that the transmission loss can be reduced.

Figure 12:
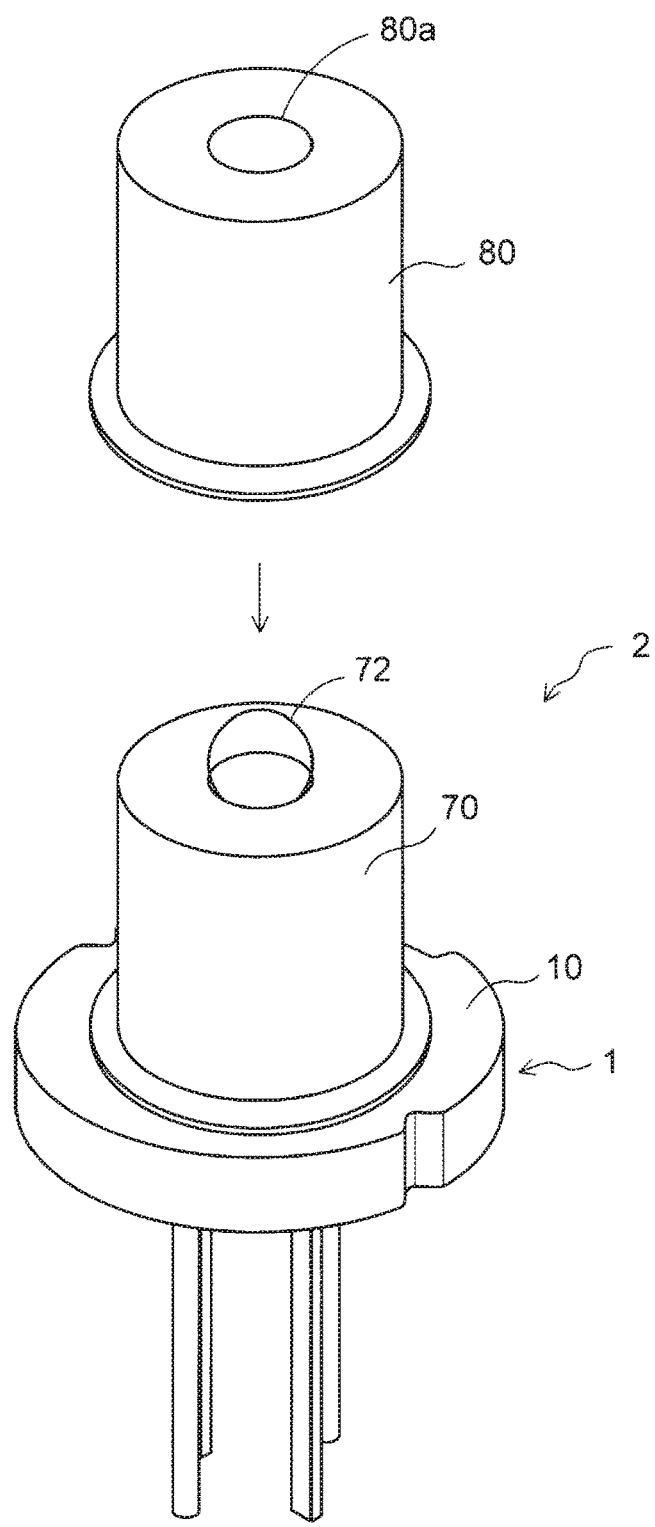
FIG. 12 is a perspective view showing a state in which a lens cap and a fiber holder are attached to the optical element device in FIGS. 11A and 11B.

Successively, as shown in FIG. 12, a lens cap 70 is attached to the metal base 10 of the optical element device 2 in FIG. 11A. A transparent ball lens 72 is mounted on a central portion of a front end of the lens cap 70.

Further, as shown in FIG. 12, a fiber holder 80 is likewise attached on the lens cap 70. An opening portion 80a is provided at a central portion of a front end of the fiber holder 80 to be formed as a cavity.

In the optical element device 2, an electric signal is supplied from the connection portion C1 or C2 of the lead wiring portion 21b or 22b of the first or second lead 21 or 22 to the semiconductor laser element 60 through the wire W1 or W2, as shown in the aforementioned FIGS. 11A and 11B.

Thus, light is emitted upward from a light-emitting part at an upper end of the semiconductor laser element 60. The light emitted from the semiconductor laser element 60 is condensed by the transparent ball lens 72 of the lens cap 70 and transmitted to an external optical fiber from the opening portion 80a of the fiber holder 80.

On this occasion, monitor light emitted from a lower end of the semiconductor laser element 60 is incident on a light-receiving part of the photodiode 62. In this manner, the light emitted from the semiconductor laser element 60 is monitored by the photodiode 62 so that the output of the semiconductor laser element 60 can be controlled.

The aforementioned optical element package 1 is used in the optical element device 2 according to the embodiment. Accordingly, matching in the transmission line as a whole in the optical element device 2 can be attained at a low characteristic impedance so that the optical element device 2 can support higher-speed transmission of an electric signal.

According to the present disclosure, a high frequency signal can be transmitted inside the same conductors from the lead portions to the connection portions of the lead wiring portions. Accordingly, it is possible to suppress a situation that the signal is reflected in the transmission line, so that a transmission loss can be reduced. Thus, characteristic impedance of the transmission line as a whole can be matched.

As described above, the exemplary embodiment and the modification are described in detail. However, the present invention is not limited to the above-described embodiment and the modification, and various modifications and replacements are applied to the above-described embodiment and the modifications without departing from the scope of claims.

Various aspects of the subject matter described herein are set out non-exhaustively in the following numbered clauses:

1) A method of manufacturing an optical element package, the method comprising:

a) preparing a metal base comprising: an eyelet comprising an upper surface and a lower surface opposite to the upper surface; a heat releasing part disposed on the upper surface of the eyelet; and a through hole formed through the eyelet to extend from the upper surface of the eyelet to the lower surface of the eyelet;

b) preparing a lead;

c) sealing the lead by a certain member provided in the through hole, wherein a portion of the lead extending from the lower surface of the eyelet is defined as a lead portion, and a portion of the lead extending from the upper surface of the eyelet is defined as a lead wiring portion; and d) disposing an insulating substrate between the lead wiring portion and the heat releasing part.

2) The method of clause (1), wherein an element mounting pad configured to mount an optical element thereon is disposed on the front surface of the insulating substrate, and in step (d), the insulating substrate is disposed between the lead wiring portion and the heat releasing part such that the lead wiring portion faces the element mounting pad.

3) The method of clause (1), wherein a metal layer is formed on the back surface of the insulating substrate, and in step (d), the metal layer is bonded to the heat releasing part, and the lead wiring portion directly contacts the insulating substrate.

4) The method of clause (1), wherein the lead comprises a first lead and a second lead, the through hole comprises a first through hole and a second through hole, wherein the step (c) comprises:

preparing a lead member comprising the first lead, the second lead, and a tie-bar connecting the first lead and the second lead;

sealing the first lead by a first member provided in the first through hole;

sealing the second lead by a second member provided in the second through hole; and removing the tie-bar from the first lead and the second lead.

5) The method of clause (1), wherein between step (c) and step (d), e) disposing a spacer between the lead wiring portion and the heat releasing part;

f) pressing the lead wiring portion against the spacer to form a bent portion in the lead wring portion such that a surface of the lead wiring portion facing the spacer is substantially in parallel with a surface of the spacer.

What is claimed is:

1. An optical element package comprising:

an eyelet made of metal and comprising an upper surface and a lower surface opposite to the upper surface;

a heat releasing part disposed on the upper surface of the eyelet;

a through hole formed through the eyelet to extend from the upper surface of the eyelet to the lower surface of the eyelet;

a lead fixed to the eyelet by a glass, the lead passing through the through hole and comprising a lead portion and a lead wiring portion which are integrally formed as a unitary piece, the lead portion extending from the lower surface of the eyelet and the lead wiring portion extending from the upper surface of the eyelet; and an insulating substrate disposed between the lead wiring portion and the heat releasing part and comprising a front surface and a back surface opposite to the front surface, wherein a light-emitting element is to be disposed on the front surface of the insulating substrate, wherein the lead wiring portion directly contacts the front surface of the insulating substrate, and the lead wiring portion is to be electrically connected to the light-emitting element via a wire, wherein an element mounting pad configured to mount the light-emitting element thereon is disposed on the front surface of the insulating substrate, and the lead wiring portion is disposed on the front surface of the insulating substrate to face the element mounting pad, wherein the lead wiring portion comprises: a connecting portion bent toward the element mounting pad; and a bent portion bent toward the insulating substrate and the heat releasing part, and wherein a surface of the lead wiring portion facing the front surface of the insulating substrate is substantially in parallel with the front surface of the insulating substrate.

2. The optical element package of claim 1, wherein a metal layer is formed on the back surface of the insulating substrate, and the metal layer is bonded to the heat releasing part.

3. The optical element package of claim 2,
the insulating substrate is a ceramic substrate or a resin substrate, and the element mounting pad and the metal layer is formed of a metal plating layer.

4. An optical element device comprising:
an optical element package comprising:
an eyelet made of metal and comprising an upper surface and a lower surface opposite to the upper surface;
a heat releasing part disposed on the upper surface of the eyelet;
a through hole formed through the eyelet to extend from the upper surface of the eyelet to the lower surface of the eyelet;
a lead fixed to the eyelet by a glass, the lead passing through the through hole and comprising a lead portion and a lead wiring portion which are integrally formed as a unitary piece, the lead portion extending from the lower surface of the eyelet and the lead wiring portion extending from the upper surface of the eyelet; and
an insulating substrate disposed between the lead wiring portion and the heat releasing part and comprising a front surface and a back surface opposite to the front surface, wherein the lead wiring portion directly contacts the front surface of the insulating substrate;
an element mounting pad disposed on the front surface of the insulating substrate;
a light-emitting element mounted on the element mounting pad; and
a wire configured to connect the light-emitting element and the lead wiring portion,
wherein the lead wiring portion is disposed on the front surface of the insulating substrate to face the element mounting pad,
wherein the lead wiring portion comprises: a connecting portion bent toward the element mounting pad; and a bent portion bent toward the insulating substrate and the heat releasing part, and
wherein a surface of the lead wiring portion facing the front surface of the insulating substrate is substantially in parallel with the front surface of the insulating substrate.

5. The optical element device of claim 4, wherein a metal layer is formed on the back surface of the insulating substrate, and the metal layer is bonded to the heat releasing part.

6. The optical element device of claim 5, wherein the insulating substrate is a ceramic substrate or a resin substrate, and the element mounting pad and the metal layer is formed of a metal plating layer.

* * * * *